United States Patent
Lim et al.

(10) Patent No.: US 10,359,451 B2
(45) Date of Patent: Jul. 23, 2019

(54) SEMICONDUCTOR DEVICE

(71) Applicant: SK hynix Inc., Gyeonggi-do (KR)

(72) Inventors: Yu-Ri Lim, Gyeonggi-do (KR);
Jong-Man Im, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 283 days.

(21) Appl. No.: 15/085,575

(22) Filed: Mar. 30, 2016

(65) Prior Publication Data

US 2017/0131330 A1    May 11, 2017

(30) Foreign Application Priority Data

Nov. 9, 2015 (KR) ................ 10-2015-0156624

(51) Int. Cl.
*G01R 31/30* (2006.01)
*G01R 19/165* (2006.01)
*G01R 31/3187* (2006.01)
*G11C 29/02* (2006.01)
*G11C 29/12* (2006.01)
*G11C 29/36* (2006.01)

(52) U.S. Cl.
CPC ....... *G01R 19/165* (2013.01); *G01R 31/3004* (2013.01); *G01R 31/3187* (2013.01); *G11C 29/021* (2013.01); *G11C 29/1201* (2013.01); *G11C 29/12015* (2013.01); *G11C 29/36* (2013.01); *G11C 2029/3602* (2013.01)

(58) Field of Classification Search
CPC ............ G01R 19/165; G01R 19/16504; G01R 19/16509; G01R 19/16514; G01R 19/16519; G01R 19/16523; G01R 19/16526; G01R 19/16533; G01R 19/16538; G01R 19/16542; G01R 19/16547; G01R 19/16552; G01R 19/16557; G01R 19/16561; G01R 31/3004; G01R 31/3008; G01R 31/3012; G01R 31/3016
USPC ................................................... 327/276
See application file for complete search history.

(56) References Cited

U.S. PATENT DOCUMENTS

| | | | |
|---|---|---|---|
| 8,248,094 B2* | 8/2012 | Bhushan .......... | G01R 31/31727 324/617 |
| 2010/0109641 A1* | 5/2010 | Noda ............... | G01R 31/31725 324/76.77 |
| 2011/0121874 A1* | 5/2011 | Kaneko ............ | H03L 7/08 327/157 |

FOREIGN PATENT DOCUMENTS

KR    1020100005610    1/2010

* cited by examiner

*Primary Examiner* — Patrick C Chen
(74) *Attorney, Agent, or Firm* — IP & T Group LLP

(57) ABSTRACT

A semiconductor device includes a period defining block suitable for generating a period defining signal corresponding to a predetermined test time period based on a test mode signal and one or more command signals; and a monitoring block suitable for generating a monitoring signal corresponding to an oscillation signal during the test time period based on the period defining signal.

9 Claims, 4 Drawing Sheets

SEMICONDUCTOR DEVICE

CROSS-REFERENCE TO RELATED APPLICATIONS

The present application claims priority of Korean Patent Application No. 10-2015-0156624, filed on Nov. 9, 2015, which is incorporated herein by reference in its entirety.

BACKGROUND

1. Field

Exemplary embodiments of the present invention relate to a semiconductor design technology and, more particularly, to a semiconductor device supporting a test mode.

2. Description of the Related Art

Semiconductor devices may have unintended characteristics different from the originally intended characteristics based on design due to variations in process, voltage and temperature (PVT). Such unintended characteristics may cause performance the semiconductor devices to deteriorate.

Therefore if the characteristics of the semiconductor devices are accurately predicted, the performance of the semiconductor devices may be improved, and the cause of the deterioration may be handled.

SUMMARY

Various embodiments of the present invention are directed to a semiconductor device that may accurately monitor an amount of a voltage drop of a power supply voltage during a predetermined period.

In addition, various embodiments of the present invention are directed to a semiconductor device that may accurately monitor minimum and maximum amounts of a voltage drop of the power supply voltage during the predetermined period.

According to an embodiment of the present invention, a semiconductor device includes: a period defining block suitable for generating a period defining signal corresponding to a predetermined test time period based on a test mode signal and one or more command signals; and a monitoring block suitable for generating a monitoring signal corresponding to an oscillation signal during the test time period based on the period defining signal.

The command signals may include a column command signal having a gapless pattern.

The period defining block may include: a command analysis unit suitable for generating a period start signal corresponding to a first input number of the column command signal and a period termination signal corresponding to a second input number of the command signal based on the column command signal; and a period defining signal generation unit suitable for generating the period defining signal based on the test mode signal, the period start signal and the period termination signal.

The command signal may include a column command signal and a precharge command signal.

The period defining block may include: a command analysis unit suitable for generating a period start signal based on the column command signal and a period termination signal based on the precharge command signal; and a period defining signal generation unit suitable for generating the period defining signal based on the test mode signal, the period start signal and the period termination signal.

The monitoring block may include: an oscillation signal generation unit suitable for generating the oscillation signal during the predetermined test time period based on the period defining signal; a counting unit suitable for counting the oscillation signal to generate a count signal; and a monitoring signal output unit suitable for outputting the count signal as the monitoring signal based on an output control signal.

The osculation signal generation unit r lay use a power supply voltage, and generate the oscillation signal having a period varied depending, on a level of the power supply voltage.

The output control signal may be activated after a test mode including the test time period terminates, and the monitoring signal output unit may output the monitoring signal to a global input/output line based on the output control signal.

According to an embodiment of the present invention, semiconductor device includes: a period defining block suitable for generating a period defining signal corresponding to a predetermined test time period based on a test mode signal and one or more command signals; and a monitoring block suitable for counting a clock signal during a plurality of count periods included in the test time period based on the period defining signal, and generating a minimum count value and a maximum count value among count values of the clock signal corresponding to the respective count periods as a monitoring signal.

the command signals may include a column command signal having a gapless pattern.

The period defining block may include: a command analysis unit suitable for generating a period start signal corresponding to a first input number of the column command signal and a period termination signal corresponding to a second input number of the command signal based on the column command signal; and a period defining signal generation unit suitable for generating the period defining signal based on the test mode signal, the period start signal and the period termination signal.

The command signal may include a column command signal and a precharge command signal.

The period defining block may include: a command analysis unit suitable for generating a period start signal based on the column command signal and a period termination signal based on the precharge command signal; and a period defining signal generation unit suitable for generating the period defining signal based on the test mode signal, the period start signal and the period termination signal.

The monitoring block may include: an oscillation signal generation unit suitable for generating the oscillation signal during the predetermined test time period based on the period defining signal; a first counting unit suitable for counting the oscillation signal to generate a first count signal; a count detection unit suitable for generating a count repeat period signal, which is activated during the respective count periods corresponding to a set count range, based on the first count signal; a second counting unit suitable for counting the clock signal during the respective count periods to generate a second count signal for each count period based on the count repeat period signal and the clock signal; a first update unit suitable for updating the minimum count value based on the second count signal; a second update unit suitable for updating the maximum count value based on the second count signal; and a monitoring signal output unit suitable for sequentially outputting the minimum count value and the maximum count value as the monitoring signal based on first and second output control signals.

The oscillation signal generation unit may use a predetermined power supply voltage and generate the oscillation signal having a variable period corresponding to a voltage drop of the power supply voltage.

The clock signal may have a fixed period regardless of the power supply voltage.

The first and second output control signals may be activated after a test mode including the predetermined test time period terminates, and wherein the monitoring signal output unit outputs the monitoring signal to a global input/output line based on the first and second output control signals.

According to an embodiment of the present invention, A method of operation of a semiconductor device, the method includes: generating a period defining signal corresponding to a test mode period based on a test mode signal and a command signal; and generating a monitoring signal corresponding to an oscillation signal during the test time period based on the period defining signal.

The command signal includes at least one of a column command signal and a precharge command signal.

The generating of the monitoring signal may include: counting the oscillation signal during the test time period to generate the first count signal; generating a count repeat period signal, which is activated during a plurality of count periods corresponding to a set count range, based on the first count signal; counting a clock signal during the respective count periods based on the count repeat period signal; and generating a minimum count value and a maximum count value among count values of the dock signal corresponding to the respective count periods as the monitoring signal.

DETAILED DESCRIPTION

Figure 1:
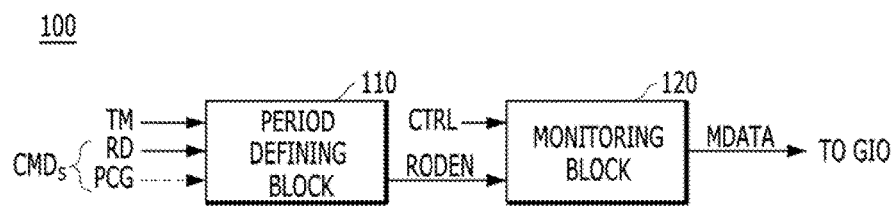
FIG. 1 is a block diagram illustrating a semiconductor device including a period defining block and a monitoring block, according to an embodiment of the present invention.

Various embodiments of the present invention are described below in more detail with reference to the accompanying drawings. The present invention may, however, be embodied in different forms and should not be construed as limited to the embodiments set forth herein. Rather, these embodiment are provided so that this disclosure is thorough and complete, and fully convey the scope of the present invention to those skilled in the art. Throughout the disclosure, like reference numerals refer to like parts throughout the various figures and embodiments of the present invention.

The terminology used herein is for the purpose of describing particular embodiments only and is not intended to be limiting of the to inventive concept. As used herein, the singular forms "a", "an" and "the" are intended to include the plural forms as well, unless the context clearly indicates otherwise. It will be further understood that the terms "comprises" and/or "comprising," when used in this specification, indicate the presence of stated features, but do not preclude the presence or addition of one or more other features. As used herein the term "and/or" indicates any and all combinations of one or more of the associated listed items.

In the embodiments of the present invention described herein, a memory device, such as a DRAM is described as an example of a semiconductor device. It is further described as an example, that a voltage drop of a power supply voltage VDD is monitored during a read pattern period among predetermined operation patterns in a test mode.

FIG. 1 is a block diagram illustrating a semiconductor device 100 according to an embodiment of the present invention.

Referring to FIG. 1, the semiconductor device 100 may include a period defining block 110, and a monitoring block 120.

The period defining block 110 may generate a period defining signal RODEN corresponding to a predetermined test time period (i.e., a predetermined test section) based on a test mode signal TM and one or more command signals CMDs.

Figure 4:
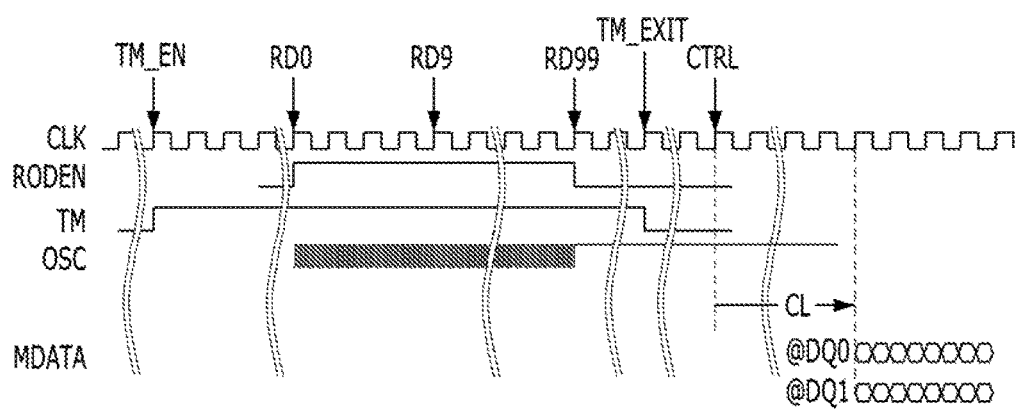
FIG. 4 is a timing diagram for describing an operation of the semiconductor device shown in FIG. 1.

The test mode signal TM may be generated based on a test mode entry signal TM_EN and a test mode exit signal TM_EXIT (refer to FIG. 4). The command signals CMDs may include at least one of a read command signal RD and a precharge command signal PCG. Although operations in response to a read command signal RD will be described as an example in the described embodiments of the present invention, the inventive concept is not limited to this. For example, a column command signal, such as a write command signal or a command signal corresponding to a pattern period other than a read pattern period may be used. The read pattern period corresponds to the read command signal RD.

The monitoring block 120 may generate a monitoring signal MDATA corresponding to an oscillation signal CSC (refer to FIGS. 3 and 4) generated during a test time period in response to the period defining signal RODEN. The monitoring signal MDATA may be outputted to a predetermined output path, for example, a global input/output line GIO, based on an output control signal CTRL.

Figure 2:
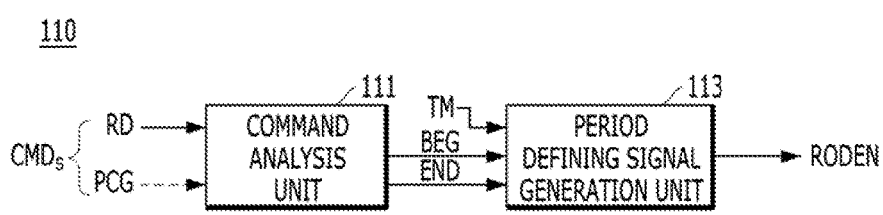
FIG. 2 is a detailed diagram of an example configuration of the period defining block shown in FIG. 1.

FIG. 2 is a detailed diagram of an example configuration of the period defining block 110 shown in FIG. 1.

Referring to FIG. 2, the period defining block 110 may include a command analysis unit 111, and a period defining signal generation unit 113.

The command analysis unit 111 may generate a period start signal BEG and a period termination signal END based on the command signals CMDs. When the command signals CMDs include the read command signal RD, the command analysis unit 111 may count the input number of the read command signal RD. When the input number of the read command signal RD becomes a first input number, the command analysis unit 111 may activate the period start signal BEG, and when the input number of the read command signal RD becomes a second input number, the command analysis unit 111 may activate the period termination signal END. For example, the period start signal BEG is activated when a first read command signal is inputted, and the period termination signal END is activated when a 100th read command signal is inputted.

Further, when the command signals CMDs include the read command signal RD and the precharge command signal PCG, the command analysis unit 111 may activate the period start signal BEG based on the read command signal RD, and activate the period termination signal END based on the precharge command signal PCG. For example, the period start signal BEG is activated based on a first read command signal, and the period termination signal END is activated based on a first precharge command signal. In the foregoing two cases, it is assumed that the read command signal RD is inputted in a gapless pattern.

The period defining signal generation unit 113 may generate the period defining signal RODEN based on the test mode signal TM, the period start signal BEG and the period termination signal END. The period defining signal generation unit 113 may be activated based on the test mode signal TM. The period defining signal RODEN may be activated based on the period start signal BEG, and deactivated based on the period termination signal END. For example, the period defining signal generation unit 113 may include an SR latch that receives the period start signal BEG as a set signal and the period termination signal END as a reset signal.

Figure 3:
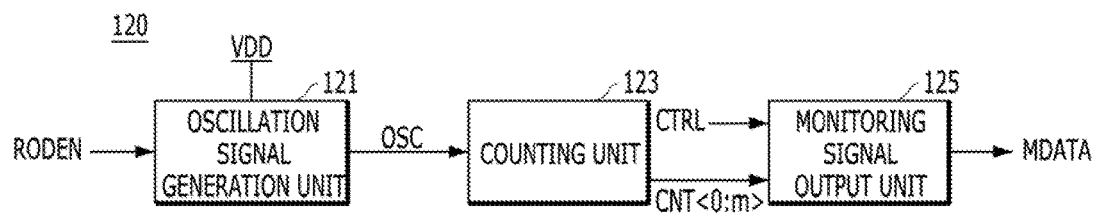
FIG. 3 is a detailed diagram of an example configuration of the monitoring block shown in FIG. 1.

FIG. 3 is a detailed diagram of an example configuration of the monitoring block 120 shown in FIG. 1.

Referring to FIG. 3, the monitoring block 120 may include an oscillation signal generation unit 121, a counting unit 123, and a monitoring signal output unit 125.

The oscillation signal generation unit 121 may generate the oscillation signal OSC in response to the period defining signal RODEN. In other words, the oscillation signal generation unit 121 outputs the oscillation signal OSC that toggles while the period defining signal RODEN is activated. Since the oscillation signal generation unit 121 uses a power supply voltage VDD to generate the oscillation signal OSC, the oscillation signal OSC may have a period (i.e., a frequency) varied depending on a level of the power supply voltage VDD. For example, the oscillation signal generation unit 121 may include a ring oscillator.

The counting unit 123 may count the oscillation signal OSC to generate count signals CNT<0:m>.

The monitoring signal output unit 125 may output the count signals CNT<0:m> as the monitoring signal MDATA in response to the output control signal CTRL. For example, the monitoring signal output unit 125 may include a latch circuit, such as a pipe latch.

FIG. 4 is a timing diagram for describing an operation of the semiconductor device 100 shown in FIG. 1, according to an embodiment of the invention. It is assumed that the read command signal RD having the gapless pattern is used as a command signal.

Referring to FIG. 4, the period defining block 110 may generate the period defining signal RODEN based on the test mode signal TM and the read command signal RD. For example, while the test mode signal TM is activated to a high logic level, the period defining block 110 may activate the period defining signal RODEN to a high logic level when the first read command signal RD0 is inputted and deactivate the period defining signal RODEN to a low logic level when the 100th read command signal RD99 is inputted.

The monitoring block 120 may generate the oscillation signal OSC in response to the period defining signal RODEN, generate the count signals CNT<0:m> based on the oscillation signal OSC, and output the count signals CNT<0:m> as the monitoring signal MDATA in response to the output control signal CTRL. For example, the monitoring block 120 may generate the oscillation signal OSC while the period defining signal RODEN is activated to the high logic level. The count signals CNT<0:m> may be generated by counting the number of times that the oscillation signal OSC toggles. The count signals CNT<0: m> may be latched to be outputted as the monitoring signal MDATA to the global input/output line GIO in response to the output control signal CTRL.

The output control signal CTRL may be activated after read pattern period corresponding to the read command signal RD terminates except for a period when a read data signal is transmitted through the global input/output line GIO. The monitoring signal MDATA may be outputted to an external device through an output path where the read data signal is outputted. The output path may include a path ranging from the global input/output line GIO to data pads DQ0 and DQ1. In this case, the monitoring signal MDATA may be outputted to the external device through the data pads DQ0 and DQ1 after the output control signal CTRL is inputted, and a predetermined latency, e.g., a column address strobe (CAS) latency CL, passes.

The monitoring block 120 may generate the oscillation signal OSC using the power sup ply voltage VDD. For example, a ring oscillator has CMOS inverters using the power supply voltage VDD as a pull-up voltage. Transition times of the CMOS inverters vanes depending on a level of the power supply voltage VDD, and thus, a period (i.e., a frequency) of the oscillation signal OSC is determined based on the power supply voltage VDD. For example, the oscillation signal OSC may have a variable period (i.e., a frequency) corresponding to a voltage drop of the power supply voltage VDD. This means that an amount of a voltage drop of the power supply voltage VDD is reflected in the period of the oscillation signal OSC. Consequently, a data capable of predicting the amount of the voltage drop of the power supply voltage VDD may be reflected in the monitoring signal MDATA.

According to the embodiment of the present invention described above an amount of the voltage drop of the power supply voltage VDD may be monitored during a desired pattern period.

Figure 5:
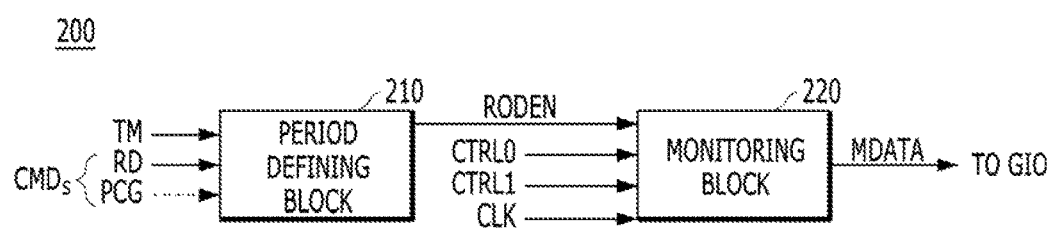
FIG. 5 is a block diagram illustrating a semiconductor device comprising a period defining block and a monitoring block, according to another embodiment of the present invention.

FIG. 5 is a block diagram illustrating a semiconductor device 200, according to another embodiment of the present invention.

Referring to FIG. 5, the semiconductor device 200 may include a period defining block 210, and a monitoring block 220.

The period defining block 210 may have a structure similar to the period defining block 110 shown in FIG. 2, and thus detailed descriptions thereon are omitted.

The monitoring block 220 may count a clock signal CLK during a plurality of count periods included in a predetermined test time period (i.e., a predetermined test section) based on a period defining signal RODEN, and generate a minimum count value and a maximum count value among count values of the clock signal CLK corresponding to the respective count periods, as a monitoring signal MDATA. The monitoring signal MDATA may be outputted to a predetermined output path, for example, a global input/output line GIO, based on first and second output control signals CTRL0 and CTRL1.

Figure 6:
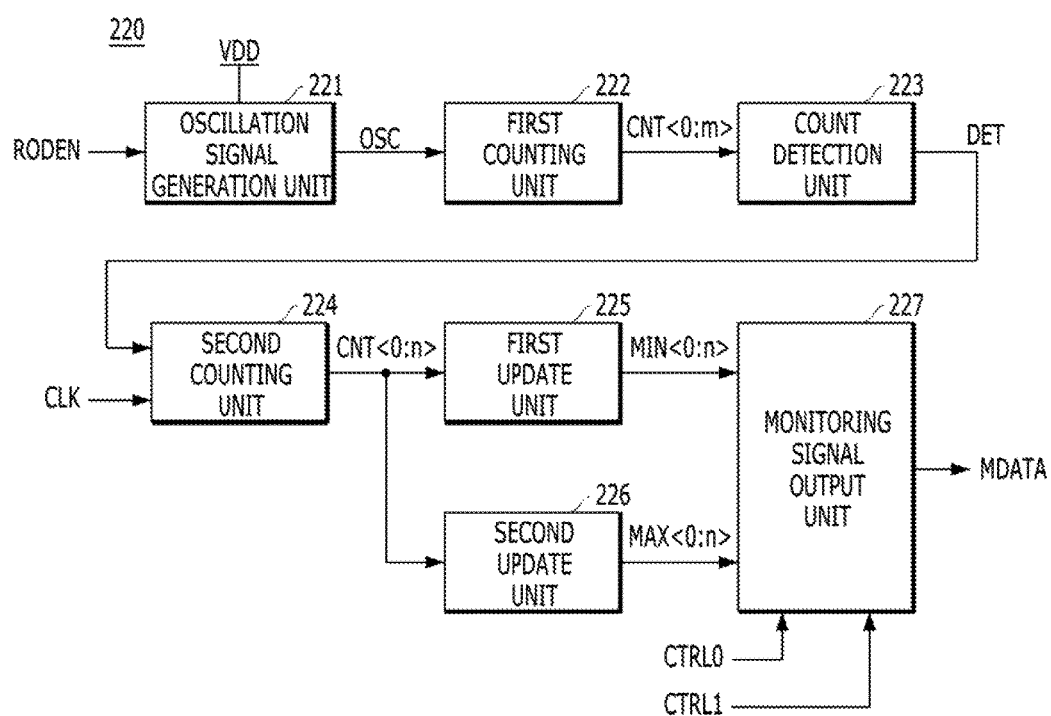
FIG. 6 is a detailed diagram of an example configuration of the monitoring block shown in FIG. 5.

FIG. 6 is a detailed diagram of the monitoring block 220 shown in FIG. 5.

Referring to FIG. 6, the monitoring block 220 may include an oscillation signal generation unit 221, a first counting unit 222, a count detection unit 223, a second counting unit 224, a first update unit 225, a second update unit 226, and a monitoring signal output unit 227.

The oscillation signal generation unit 221 may generate an oscillation signal OSC in response to the period defining signal RODEN. In other words, the oscillation signal generation unit 221 outputs the oscillation signal OSC that toggles while the period defining signal RODEN is activated. Since the oscillation signal generation unit 221 uses a power supply voltage VDD to generate the oscillation signal OSC, the oscillation signal OSC may have a period (i.e., a frequency) varied depending on a level of the power supply voltage VDD. For example, the oscillation signal generation unit 221 may include a ring oscillator.

The first counting unit 222 may count the oscillation signal OSC to generate first count signals CNT<0:m>.

The count detection unit 3 may generate a count repeat period signal DET, which is activated during the count periods corresponding to a set count range, based on the first count signals CNT<0:m>. When the count range is set to "from 1 to 20", the count detection unit 223 may activate the count repeat period signal DET whenever the oscillation signal OSC toggles 20 times. For example, the count detection unit 223 may activate the count repeat period signal DET during a first count period in which the oscillation signal OSC toggles 1 st to 20th times, and activate the count repeat period signal DET during a second count period in which the oscillation signal OSC toggles 21th to 40th times. Since a period (i.e., a frequency) of the oscillation signal OSC varies depending on the level change (e.g., voltage drop) of the power supply voltage VDD, activation periods of the count repeat period signal DET may be different from each other for the respective count periods.

The second counting unit 224 may count the clock signal CLK for each count period based on the count repeat period signal DET to generate second count signals CNT<0:n>. The clock signal CLK may have a fixed period regardless of the power supply voltage VDD. The clock signal CLK may be supplied from an external device.

The first update unit 225 may update the minimum count value of the second count signals CNT<0:n> based on the second count signals CNT<0:n> for each count period. For example, the first update unit 225 may select the second count signals CNT<0:n> corresponding to the minimum count value by sequentially comparing the second count signals CNT<0:n> for each count period, and may output the selected second count signals CNT<0:n> as minimum count signals MIN<0:n>.

The second update unit 226 may update the maximum count value of the second count signals CNT<0:n> based on the second count signals CNT<0:n> for each count period. For example, the second update unit 226 may select the second count signals CNT<0:n> corresponding to the maximum count value by sequentially comparing the second count signals CNT<0:n> for each count period, and may output the selected second count signals CNT<0:n> as maximum count signals MAX<0:n>.

The monitoring signal output unit 227 may sequentially output the minimum count signals MIN<0:n> and the maximum count signals MAX<0:n> as the monitoring signal MDATA based on the first and second output control signals CTRL0 and CTRL1. For example, the monitoring signal output unit 227 may include a latch circuit (e.g., a pipe latch) and a multiplexer.

Figure 7:
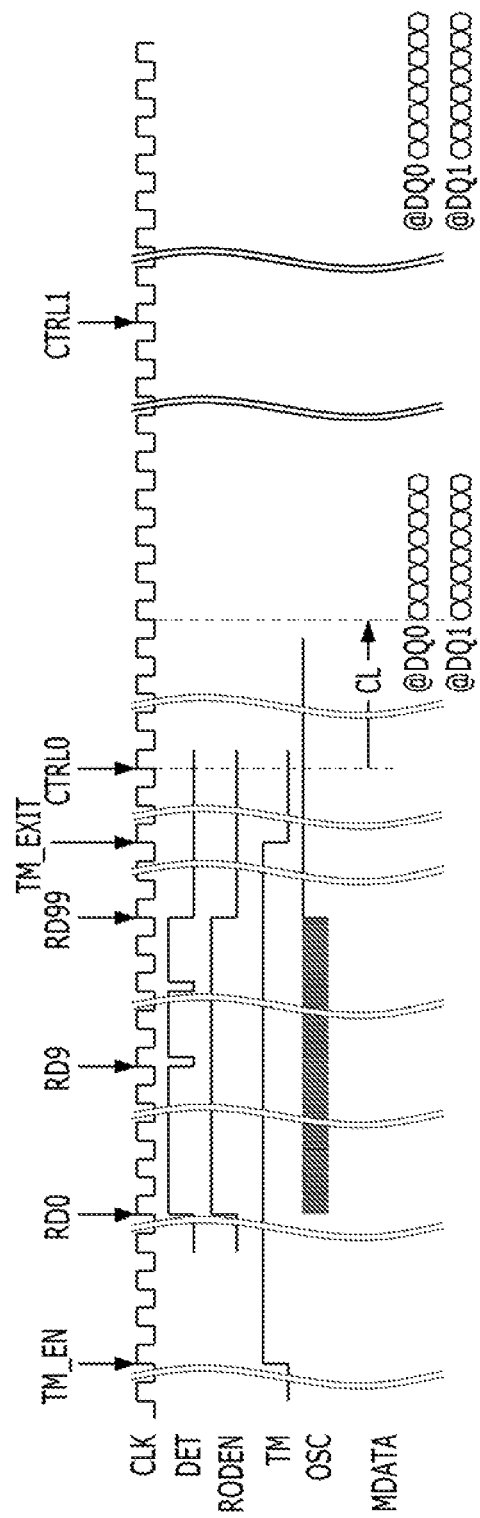
FIG. 7 is a timing diagram for describing an operation of the semiconductor device shown in FIG. 5.

FIG. 7 is a timing diagram for describing an operation of the semiconductor device 200 shown in FIG. 5. It is assumed that a read command signal RD having a gapless pattern is used as a command signal.

Referring to FIG. 7, the period defining block 210 may generate the period defining signal RODEN corresponding to the test time period based on a test mode signal TM and the read command signal RD. For example, while the test mode signal TM is activated to a high logic level, the period defining block 210 may activate the period defining signal RODEN to a high logic level when a first read command signal RD0 is inputted and may deactivate the period defining signal RODEN to a low logic level when a 100th read command signal RD99 is inputted.

The monitoring block 220 may count the clock signal CLK during the count periods included in the test time period in response to the period defining signal RODEN and may generate the minimum count value and the maximum count value among the count values of the clock signal CLK corresponding to the count periods as the monitoring signal MDATA.

For example, the monitoring block 220 may count the oscillation signal OSC during the test time period to generate the first count signals CNT<0:m>, activate the count repeat period signal DET to a high logic level during the count periods corresponding to the count range, which is previously set, based on the first count signals CNT<0:m>. The monitoring block 220 may count the clock signal CLK to generate the second count signals CNT<0:n> for each count period, and output the second count signals CNT<0:n> corresponding to the minimum count value as the minimum count signals MIN<0:n> and the second count signals CNT<0:n> corresponding to the maximum count value as the maximum count signals MAX<0:n> by sequentially comparing the second count signals CNT<:n> for each count period. The monitoring block 220 may sequentially output the minimum count signals MIN<0:n> and the maximum count signals MAX<0:n> as the monitoring signal MDATA to the global input/output line GIO based on the first and second output control signals CTRL0 and CTRL1.

The first and second output control signals CTRL0 and CTRL1 may be activated after a read pattern period corresponding to the read command signal RD terminates except for a period when a read data signal is transmitted through the global input/output line GIO. The monitoring signal MDATA may be outputted to an external device through an output path where the read data signal is outputted. The output path may include a path ranging from the global input/output line GIO to data pads DQ0 and DQ1. In this case, the monitoring signal MDATA may be outputted to the external device through the data pads DQ0 and DQ1 after the first output control signal CTRL0 or the second output control signal TRL1 is inputted, and a predetermined latency, e.g., a CAS latency CL, passes.

The monitoring block 220 may generate the oscillation signal OSC using the power supply voltage VDD. Therefore, the oscillation signal OSC may have a variable period (i.e., a variable frequency) corresponding to a voltage drop of the power supply voltage VDD. In other words, an amount of a voltage drop of the power supply voltage VDD may be reflected in the period of the oscillation signal OSC. Consequently, a data capable of predicting minimum and maximum amounts of a voltage drop of the power supply voltage VDD during the test time period may be included in the monitoring signal MDATA According to the embodiment of the present invention described above, the minimum and maximum amounts of the voltage drop of the power supply voltage VDD may be monitored during a desired pattern period.

According to the embodiments of the present invention, as an amount of a voltage drop of a power supply voltage is accurately monitored during a predetermined period, the characteristics of a semiconductor device may be precisely predicted.

While the present invention has been described with respect to specific embodiments, the embodiments are not intended to be restrictive, but rather descriptive. Further, it is noted that the present invention may be achieved in various ways through substitution, change, and modification, by those skilled in the relevant art without departing from the scope of the present invention as defined by the following claims.

What is claimed is:

1. A semiconductor device, comprising:
    a period defining block configured to generate a period defining signal corresponding to a test time period based on a test mode signal and one or more command signals; and
    a monitoring block configured to count a clock signal during a plurality of count periods included in the test time period based on the period defining signal, and generate a minimum count value and a maximum count value among count values of the clock signal corresponding to the respective count periods as a monitoring signal;
    wherein the minimum count value corresponds to a minimum amount of a voltage drop of a power supply voltage and the maximum count value corresponds to a maximum amounts of a voltage drop of the power supply voltage,
    wherein the monitoring block generates an oscillation signal based on the period defining signal and determines the plurality of count periods based on the oscillation signal,
    wherein the oscillation signal has a variable period corresponding to a voltage drop of the power supply voltage, and
    wherein the clock signal has a fixed period regardless of the power supply voltage.

2. The semiconductor device of claim 1, wherein the command signals include a column command signal having a gapless pattern.

3. The semiconductor device of claim 2, wherein the period defining block includes:
    a command analysis unit configured to generate a period start signal corresponding to a first input number of the column command signal and a period termination signal corresponding to a second input number of the command signal based on the column command signal; and
    a period defining signal generation unit configured to generate the period defining signal based on the test mode signal, the period start signal and the period termination signal.

4. The semiconductor device of claim 1, wherein the command signal includes a column command signal and a precharge command signal.

5. The semiconductor device of claim 4, wherein the period defining block includes:
    a command analysis unit configured to generate a period start signal based on the column command signal and a period termination signal based on the precharge command signal; and
    a period defining signal generation unit configured to generate the period defining signal based on the test mode signal, the period start signal and the period termination signal.

6. The semiconductor device of claim 1, wherein the monitoring block includes:
    an oscillation signal generation unit configured to generate the oscillation signal during the test time period based on the period defining signal;
    a first counting unit configured to count the oscillation signal to generate a first count signal;
    a count detection unit configured to generate a count repeat period signal, which is activated during the respective count periods corresponding to a set count range, based on the first count signal;
    a second counting unit configured to count the clock signal during the respective count periods to generate a second count signal for each count period based on the count repeat period signal and the clock signal;
    a first update unit configured to update the minimum count value based on the second count signal;
    a second update unit configured to update the maximum count value based on the second count signal; and
    a monitoring signal output unit configured to sequentially output the minimum count value and the maximum count value as the monitoring signal based on first and second output control signals.

7. The semiconductor device of claim 6, wherein the oscillation signal generation unit uses the power supply voltage.

8. The semiconductor device of claim 6, wherein the first and second output control signals are activated after a test mode including the test time period terminates, and
    wherein the monitoring signal output unit outputs the monitoring signal to a global input/output line based on the first and second output control signals.

9. A method of operation of a semiconductor device, the method comprising:
    generating a period defining signal corresponding to a test mode period based on a test mode signal and a command signal; and
    generating a monitoring signal corresponding to an oscillation signal during the test time period based on the period defining signal and a clock signal,
    wherein the generating of the monitoring signal includes:
    counting the oscillation signal during the test time period to generate the first count signal;
    generating a count repeat period signal, which is activated during a plurality of count periods corresponding to a set count range, based on a first count signal;
    counting the clock signal during the respective count periods based on the count repeat period signal; and
    generating a minimum count value and a maximum count value among count values of the clock signal corresponding to the respective count periods as the monitoring signal.

* * * * *